United States Patent
Bae et al.

(10) Patent No.: US 7,902,887 B2
(45) Date of Patent: Mar. 8, 2011

(54) METHOD AND APPARATUS FOR TUNING PHASE OF CLOCK SIGNAL

(75) Inventors: Seung Jun Bae, Hwaseong-si (KR); Kwang Il Park, Yongin-si (KR); Sam Young Bang, Yongin-si (KR); Gil Shin Moon, Hwaseong-si (KR); Ki Woong Yeom, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 52 days.

(21) Appl. No.: 12/385,431

(22) Filed: Apr. 8, 2009

(65) Prior Publication Data

US 2009/0251181 A1    Oct. 8, 2009

(30) Foreign Application Priority Data

Apr. 8, 2008    (KR) ................. 10-2008-0032459

(51) Int. Cl.
*H03L 7/06*    (2006.01)
(52) U.S. Cl. .......................... 327/156; 327/147
(58) Field of Classification Search ................. 327/147, 327/156
See application file for complete search history.

(56) References Cited

U.S. PATENT DOCUMENTS

| | | | | |
|---|---|---|---|---|
| 4,020,289 A * | 4/1977 | Anderson | ................. | 370/489 |
| 4,099,137 A * | 7/1978 | Alm et al. | ................. | 330/304 |
| 6,385,126 B2 | 5/2002 | Jung et al. | | |
| 6,806,786 B1 * | 10/2004 | Lam et al. | ................. | 331/179 |
| 7,020,165 B2 * | 3/2006 | Rakib et al. | ................. | 370/485 |
| 7,209,396 B2 * | 4/2007 | Schnell | ................. | 365/193 |
| 7,239,650 B2 * | 7/2007 | Rakib et al. | ................. | 370/480 |
| 7,248,635 B1 * | 7/2007 | Arneson et al. | ................. | 375/257 |
| 7,707,617 B2 * | 4/2010 | Birleson | ................. | 725/151 |
| 7,800,432 B2 * | 9/2010 | Fu et al. | ................. | 331/4 |
| 2001/0026179 A1 * | 10/2001 | Saeki | ................. | 327/147 |
| 2010/0153792 A1 * | 6/2010 | Jang | ................. | 714/700 |

FOREIGN PATENT DOCUMENTS

| | | |
|---|---|---|
| KR | 10-2001-0073884 A | 8/2001 |
| KR | 10-2006-0095519 A | 8/2006 |
| KR | 10-2006-0135290 A | 12/2006 |

* cited by examiner

*Primary Examiner* — Lincoln Donovan
*Assistant Examiner* — Adam D Houston
(74) *Attorney, Agent, or Firm* — Lee & Morse P.C.

(57) ABSTRACT

A method and apparatus for tuning a phase of a data clock signal having a different frequency than a main clock signal. The method of tuning includes coarse tuning by receiving the data clock signal, dividing the data clock signal to generate a frequency-divided clock signal having a same frequency as the main clock signal, repeatedly shifting the frequency-divided clock signal to generate multiphase frequency-divided clock signals at a predetermined phase interval, comparing a phase of each of the multiphase frequency-divided clock signals with a phase of the main clock signal, and determining a phase shift amount based on a comparison result, and fine tuning by comparing a phase of a multiphase frequency-divided clock signal corresponding to the phase shift amount with the phase of the main clock signal and adjusting the phase of the data clock signal by a predetermined phase step based on the comparison result.

20 Claims, 13 Drawing Sheets

METHOD AND APPARATUS FOR TUNING PHASE OF CLOCK SIGNAL

BACKGROUND

1. Field

Embodiments relate to a semiconductor apparatus, and more particularly, to a method and circuit for tuning the phase of a data clock signal used to input and output data in a semiconductor apparatus.

2. Description of the Related Art

Dynamic random access memory (DRAM), for example, DDR1/2/3 and GDDR3/4, usually performs a core operation using a main clock signal and interfaces with a memory controller using a data strobe signal. In other words, data is transmitted in synchronization with the data strobe signal. The main operation of the core operation is accessing a memory cell array, i.e., a core of the DRAM, that is, writing data to or reading data from the memory cell array. At this time, the main clock signal and the data strobe signal have the same frequency. Therefore, when data is transmitted at a rising edge and a falling edge of the data strobe signal, the data is transmitted at a double data rate (DDR) with respect to the main clock signal. When a semiconductor apparatus operates in a DDR mode, a data interface speed is two times faster than a core speed.

With the development of high-speed graphics and games and the increase in speed of the memory controller, it is desired to increase the data interface speed of the semiconductor apparatus, e.g., DRAM. However, since it is very difficult to increase the speed due to the structure of the core circuit in the DRAM, there is a limit to increasing the frequency of the main clock signal. For this reason, only the data interface speed is increased by increasing the number of data bits or symbols input and output per command while the core speed of the DRAM is maintained in order to meet the requirements of systems. However, there is a limit to increasing the data interface speed with respect to the core speed of the DRAM while the main clock signal and the data strobe signal are maintained to have the same frequency in the DRAM.

SUMMARY

Embodiments are therefore directed to a semiconductor apparatus and a method and a circuit for tuning a phase of a data clock signal input to the semiconductor apparatus, which substantially overcomes one or more of the problems due to the limitations and disadvantages of the related art.

It is therefore a feature of an embodiment to provide a semiconductor apparatus adapted to tune a phase of a data clock signal employable to input and/or output data to/from a semiconductor apparatus.

It is therefore a separate feature of an embodiment to provide a method and apparatus for more quickly tuning a phase of a data clock signal or a frequency-divided signal of the data clock signal, which has a different frequency than a main clock signal, to a phase of the main clock signal in a semiconductor memory apparatus.

At least one of the above and other features and advantages of embodiments may be realized by providing a semiconductor memory apparatus configured to employ a data clock signal that has a different frequency than a main clock signal, the semiconductor memory apparatus including a clock signal receiver configured to receive the main clock signal and the data clock signal from a memory controller, and a phase tuner configured to generate a frequency-divided clock signal having a same frequency as the main clock signal by dividing a frequency of the data clock signal, generate from the frequency-divided clock signal at least four multiphase frequency-divided clock signals having the same frequency as the frequency-divided clock signal and different phases from one another, compare each phase of the at least four multiphase frequency-divided clock signals with a phase of the main clock signal, during coarse tuning, feed back each comparison result to the memory controller, and during fine tuning, compare a phase of a signal selected from the at least four multiphase frequency-divided clock signals with the phase of the main clock signal and feed back a comparison result to the memory controller.

The phase tuner may include a divider configured to divide a frequency of the data clock signal to generate the frequency-divided clock signal, a multiphase signal generator configured to repeatedly shift the frequency-divided clock signal to generate the at least four multiphase frequency-divided clock signals at a predetermined phase interval and arrange and output the at least four multiphase frequency-divided clock signals in response to a phase shift control signal set by the memory controller and a phase detector configured to compare a phase of one of the at least four arranged multiphase frequency-divided clock signals with the phase of the main clock signal and generate a phase detection signal, wherein the at least four arranged multiphase frequency-divided clock signals may be used to transmit and receive data.

The predetermined phase interval may be 90 degrees and the at least four multiphase frequency-divided clock signals may be signals obtained by shifting the frequency-divided clock signal by 0, 90, 180 and 270 degrees, respectively.

The phase shift control signal may be set by the memory controller in a mode register set circuit included in the semiconductor memory apparatus.

The phase tuner may include a divider configured to divide a frequency of the data clock signal so as to generate the frequency-divided clock signal, a multiphase signal generator configured to shift the frequency-divided clock signal by a phase shift amount corresponding to a phase shift control signal set by the memory controller to generate a phase-shifted frequency-divided clock signal, and a phase detector configured to compare a phase of the phase-shifted frequency-divided clock signal with the phase of the main clock signal and feed back a comparison result.

The phase shift amount may be 90 degrees, and the multiphase signal generator may include a multiphase generator configured to repeatedly shift the frequency-divided clock signal by 90 degrees to generate 0, 90, 180 and 270 degree frequency-divided clock signals, and a selector configured to arrange the 0, 90, 180 and 270 degree frequency-divided clock signals and output them in arranged order as first, second, third and fourth frequency-divided clock signals in response to the phase shift control signal.

The phase shift control signal may be set by the memory controller in a mode register set circuit included in the semiconductor memory apparatus.

The frequency of the main clock signal may be ½ of the frequency of the data clock signal and the phase tuner includes a divider configured to divide a frequency of the data clock signal by 2 to generate the frequency-divided clock signal.

The comparison result may be fed back to memory controller via a line used to transmit an error detection code to the memory controller.

The signal selected from the at least four multiphase frequency-divided clock signals may be one of two signals having their first edges closest to a first edge of the main clock signal among the at least four multiphase frequency-divided clock signals.

At least one of the above and other features and advantages of embodiments may be separately realized by providing a memory system using a data clock signal that has a different frequency than a main clock signal, the memory system including, a first memory apparatus configured to, receive the data clock signal, divide a frequency of the data clock signal to generate a first frequency-divided clock signal having the same frequency as the main clock signal, repeatedly shift the first frequency-divided clock signal to generate at least four multiphase frequency-divided clock signals at a predetermined phase interval, which have a same frequency as and different phases than the first frequency-divided clock signal, and compare a phase of each of the at least four multiphase frequency-divided clock signals with a phase of the main clock signal, and output a comparison result, and a memory controller configured to transmit the main clock signal and the data clock signal to the first memory apparatus, receive the comparison result from the first memory apparatus, and select one signal from the at least four multiphase frequency-divided clock signals based on the comparison result, wherein the first memory apparatus compares a phase of the selected multiphase frequency-divided clock signal with the phase of the main clock signal and feeds back a comparison result to the memory controller, and wherein the memory controller adjusts a phase of the data clock signal by a predetermined phase step based on the comparison result fed back from the first memory apparatus and transmits a phase-adjusted data clock signal to the first memory apparatus.

The memory controller may sequentially change a first phase shift control signal to sequentially shift the first frequency-divided clock signal by 0, 90, 180, and 270 degrees, wherein the first memory apparatus may generate a frequency-divided clock signal by shifting the first frequency-divided clock signal by a phase shift amount corresponding to the first phase shift control signal when the first phase shift control signal changes, compares a phase of the generated frequency-divided clock signal with the phase of the main clock signal, and feed back a phase detection signal corresponding to the comparison result to the memory controller, and wherein the memory controller may determine the first phase shift control signal for selecting a phase shift amount, by which the first frequency-divided clock signal is shifted, based on phase detection signals respectively generated with respect to the 0, 90, 180, and 270 degree shifts.

The memory controller may determine the first phase shift control signal for selecting a signal having a phase difference of ±45 degrees or less from the phase of the main clock signal from among frequency-divided clock signals generated by shifting the first frequency-divided clock signal by 0, 90, 180, and 270 degrees.

The memory system may include a second memory apparatus configured to receive the data clock signal, divide a frequency of the data clock signal to generate a second frequency-divided clock signal having the same frequency as the main clock signal, repeatedly shift the second frequency-divided clock signal to generate at least four multiphase frequency-divided clock signals at a predetermined phase interval, which have a same frequency as and different phases than the second frequency-divided clock signal, compare a phase of each of the at least four multiphase frequency-divided clock signals with the phase of the main clock signal, and output a comparison result, wherein each of the main clock signal and the data clock signal is transmitted via a single common signal line and then distributed to each of the first and second memory apparatuses.

The memory controller may sequentially change a second phase shift control signal to sequentially shift the second frequency-divided clock signal by 0, 90, 180, and 270 degrees, wherein the second memory apparatus may generate a frequency-divided clock signal by shifting the second frequency-divided clock signal by a phase shift amount corresponding to the second phase shift control signal when the second phase shift control signal changes, compare a phase of the generated frequency-divided clock signal with the phase of the main clock signal, and feed back a phase detection signal corresponding to the comparison result to the memory controller, wherein the memory controller may determine the second phase shift control signal for selecting a phase shift amount, by which the second frequency-divided clock signal is shifted, based on phase detection signals respectively generated and fed back from the second memory apparatus with respect to the 0, 90, 180, and 270 degree shifts, wherein the second memory apparatus may compare a phase of a frequency-divided clock signal, generated by shifting the second frequency-divided clock signal by the selected phase shift amount, with the phase of the main clock signal and feeds back a comparison result to the memory controller, and wherein the memory controller may adjust the phase of the data clock signal by a predetermined phase step based on the comparison result fed back from the second memory apparatus and transmits a phase-adjusted data clock signal to the second memory apparatus.

The memory controller may readjust the phase of the data clock signal to an average of the phase of the data clock signal adjusted with respect to the first memory apparatus and the phase of the data clock signal adjusted with respect to the second memory apparatus and transmit a phase-readjusted data clock signal to the first memory apparatus and the second memory apparatus.

At least one of the above and other features and advantages of embodiments may be separately realized by method of tuning a phase of a data clock signal that has a different frequency than a main clock signal, the method including coarse tuning by receiving the data clock signal, dividing the data clock signal to generate a frequency-divided clock signal having a same frequency as the main clock signal, repeatedly shifting the frequency-divided clock signal to generate at least four multiphase frequency-divided clock signals at a predetermined phase interval, which have the same frequency as and different phases than the frequency-divided clock signal, comparing a phase of each of the at least four multiphase frequency-divided clock signals with a phase of the main clock signal, and selecting one signal from the at least four multiphase frequency-divided clock signals based on a comparison result and fine tuning by comparing a phase of the selected multiphase frequency-divided clock signal with the phase of the main clock signal and adjusting the phase of the data clock signal by a predetermined phase step based on the comparison result.

The method may include transmitting the main clock signal and the data clock signal from a memory controller to a semiconductor memory apparatus, wherein the predetermined phase interval is 90 degrees.

During coarse tuning, the memory controller may sequentially change a phase shift control signal to sequentially shift the frequency-divided clock signal by 0, 90, 180, and 270 degrees, the semiconductor memory apparatus may generate a signal by shifting the frequency-divided clock signal by a phase shift amount corresponding to the phase shift control signal when the phase shift control signal changes, compares a phase of the generated signal with the phase of the main clock signal, and feeds back a phase detection signal corresponding to the comparison result to the memory controller, and the memory controller may determine the phase shift control signal for selecting a phase shift amount, by which the frequency-divided clock signal is shifted, based on phase detection signals respectively generated with respect to the 0, 90, 180 and 270 degree shifts.

During fine tuning, the semiconductor memory apparatus may generate a signal by shifting the frequency-divided clock signal by the phase shift amount corresponding to the determined phase shift control signal, compare a phase of the generated signal with the phase of the main clock signal, and feeds back a phase detection signal corresponding to a comparison result to the memory controller, and the memory controller may adjust the phase of the data clock signal by the predetermined phase step based on the phase detection signal.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
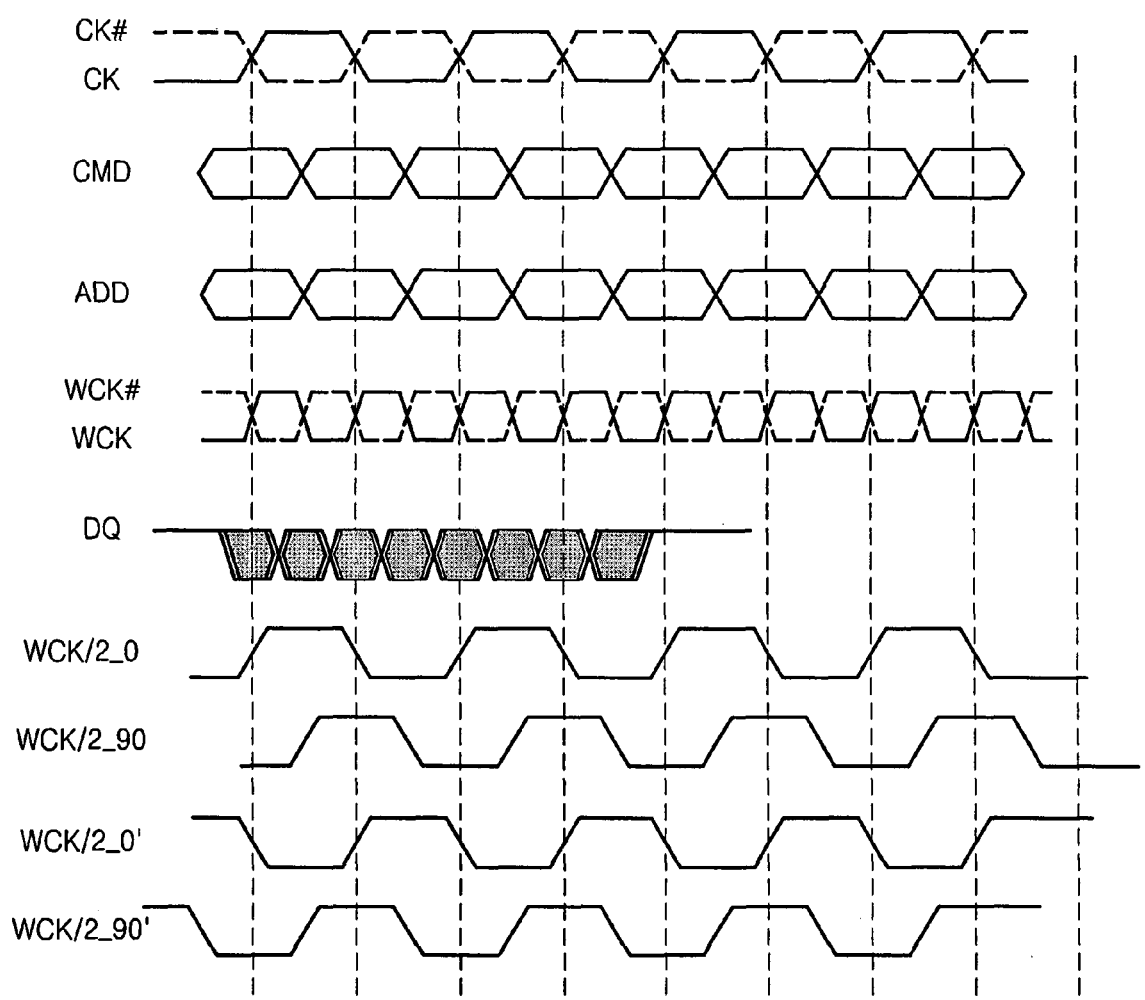
FIG. 1 illustrates a waveform diagram of operating signals of a dynamic random access memory (DRAM)

Korean Patent Application No. 10-2008-0032459, filed on Apr. 8, 2008, in the Korean Intellectual Property Office, and entitled: "Method and Apparatus for Tuning Phase of Clock Signal," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which embodiments belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates a timing diagram of signals for operating a dynamic random access memory (DRAM). Referring to FIG. 1, a data clock signal WCK instead of a data strobe signal is used for data interface between a memory controller and the DRAM. The frequency of the data clock signal WCK may be two times higher than that of a main clock signal CK used for a core operation. A command signal CMD and an address signal ADD may be transmitted and received based on the main clock signal CK. Data DQ may be transmitted based on the data clock signal WCK. The data DQ may be input and output in response to a rising edge and a falling edge of the data clock signal WCK such as double data rate (DDR) DRAM. Accordingly, a data transmission speed is doubled while the main clock signal CK maintains its frequency. In other words, the data DQ is transferred at a quadrature data rate (QDR) with respect to the main clock signal CK.

In a write operation, the DRAM samples the data DQ input from the memory controller using the data clock signal WCK. Sampled data may be stored in a memory array using the main clock signal CK. In a read operation, the DRAM reads data from the memory array using the main clock signal CK, samples the data using the data clock signal WCK, and transmits the data to the memory controller. Accordingly, data shift between an area operating based on the main clock signal CK and an area operating based on the data clock signal WCK is necessary. Also, domain crossing occurs between the main clock signal CK and the data clock signal WCK and it is difficult to satisfy a phase margin since the frequency of the data clock signal WCK is as high as 2.5 GHz. Accordingly, it may be necessary to generate a clock signal having the same frequency as the main clock signal CK by dividing the frequency of the data clock signal WCK in the DRAM. More particularly, a 0-degree frequency-divided clock signal WCK/2_0 and a 90-degree frequency-divided clock signal WCK/2_90 may be generated by dividing the frequency of the data clock signal WCK in the DRAM. However, it is difficult to make a rising edge of the main clock signal CK coincide with a rising edge of the 0-degree frequency-divided clock signal WCK/2_0 since the data clock signal WCK has two rising edges during a single period of the main clock signal CK.

Referring to FIG. 1, in such cases, while, in some instances, the 0-degree frequency-divided clock signal WCK/2_0 and the 90-degree frequency-divided clock signal WCK/2_90 may be properly synchronized with the main clock signal CK, in other instances, a 0-degree frequency-divided clock signal WCK/2_0' and a 90-degree frequency-divided clock signal WCK/2_90' may not be properly synchronized with the main clock signal CK.

A system and/or method capable of preventing the data clock signal WCK or a frequency-divided signal WCK/2 of the data clock signal WCK from being asynchronous with the main clock signal CK is desired. A system and/or method capable of reducing a time needed to synchronize the phase of the frequency-divided clock signal WCK/2 with the phase of the main clock signal CK in order to increase the operating speed of the memory apparatus is separately desired.

Embodiments of one or more aspects of the invention described herein are directed to a semiconductor apparatus, a method and/or a circuit capable of tuning a phase of a data clock signal input to the semiconductor apparatus, which substantially overcomes, e.g., such problems.

Figure 2:
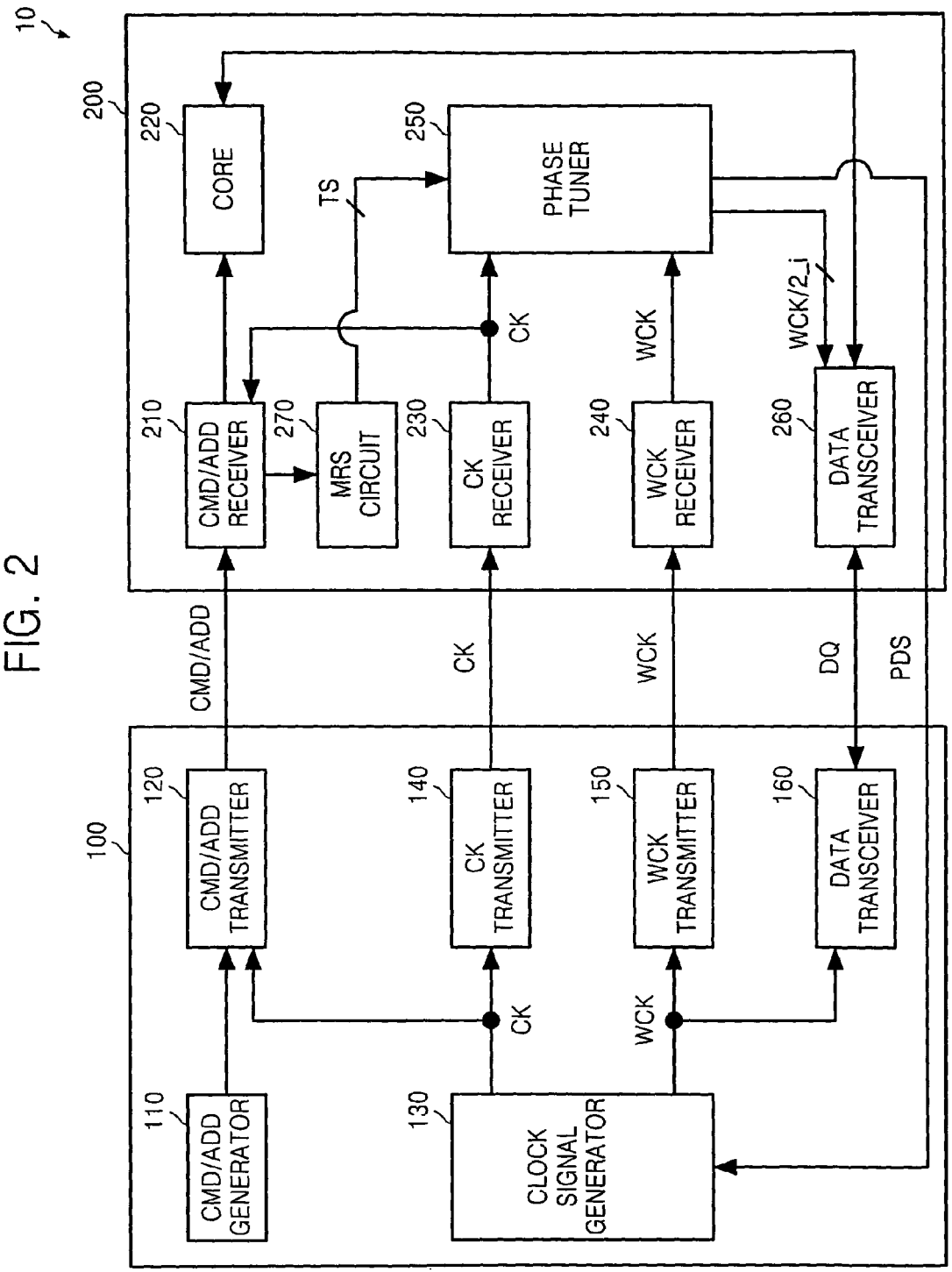
FIG. 2 illustrates a block diagram of an exemplary embodiment of a memory system.
Figure 3:
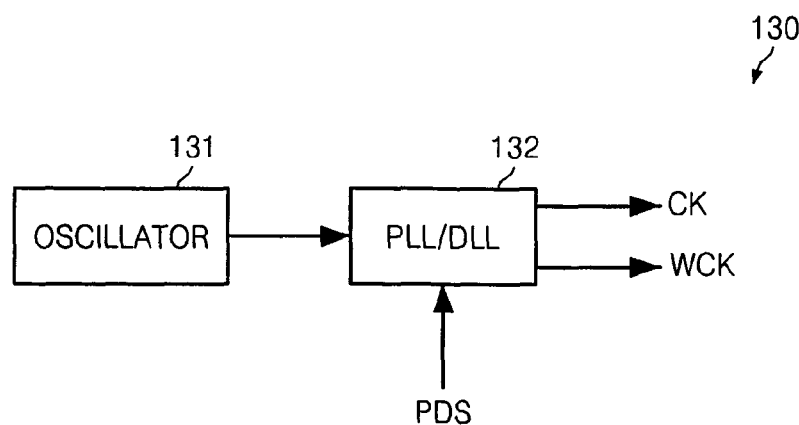
FIG. 3 illustrates a block diagram of an exemplary embodiment of a clock signal generator of FIG. 2.
Figure 4:
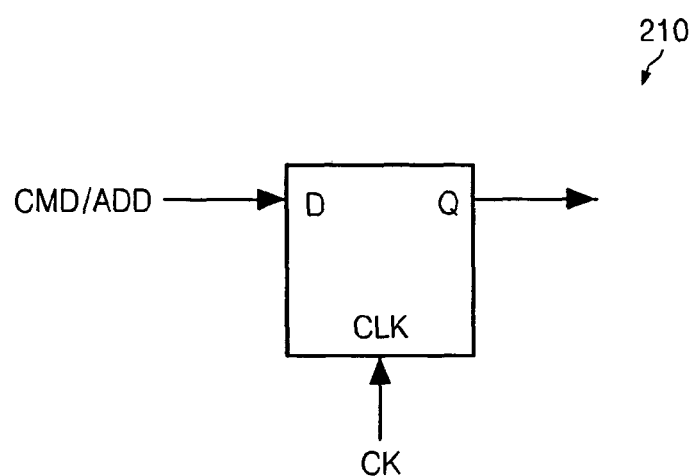
FIG. 4 illustrates a block diagram of an exemplary embodiment of a command/address receiver of FIG. 2.
Figure 5:
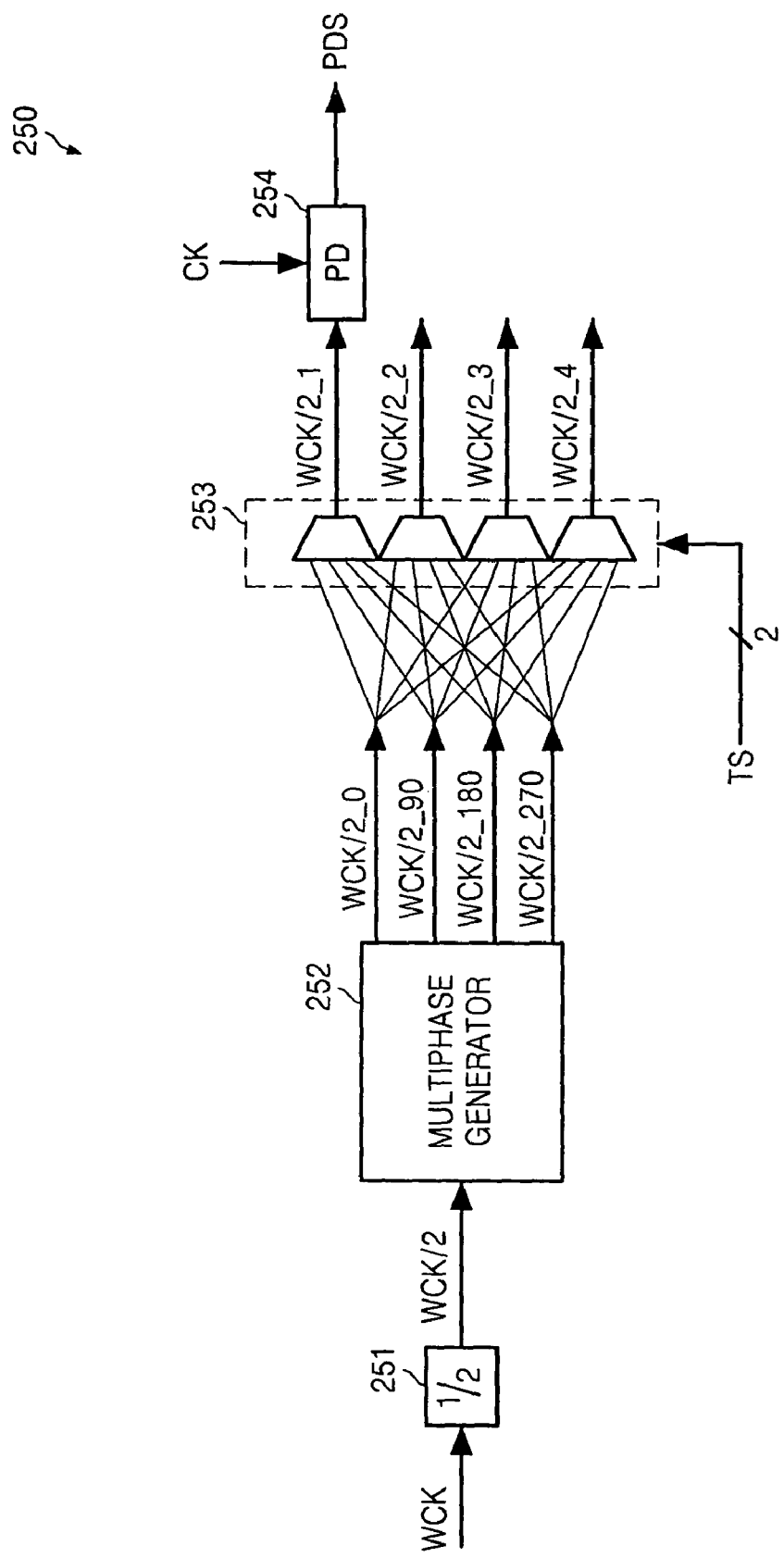
FIG. 5 illustrates a block diagram of an exemplary embodiment of a phase tuner of FIG. 2.
Figure 6:
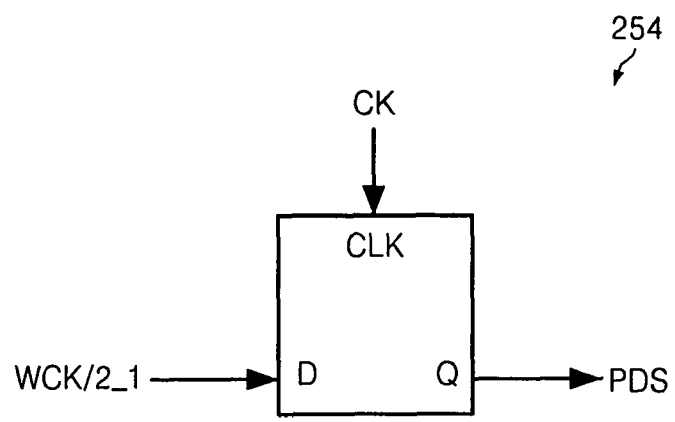
FIG. 6 illustrates a block diagram of an exemplary embodiment of a phase detector of FIG. 5.

FIG. 2 illustrates a block diagram of an exemplary embodiment of a memory system 10. FIG. 3 illustrates a block diagram of an exemplary embodiment of a clock signal generator 130 of FIG. 2. FIG. 4 illustrates a block diagram of an exemplary embodiment of a command/address receiver 210 of FIG. 2. FIG. 5 illustrates a block diagram of an exemplary embodiment of a phase tuner 250 of FIG. 2. FIG. 6 illustrates a block diagram of an exemplary embodiment of the phase detector 254 of FIG. 5. In the following description, it is assumed that the memory apparatus 200 is a DRAM. However, it should be understood that embodiments are not limited thereto.

Referring to FIG. 2, the memory system 10 may include a memory controller 100 and the memory apparatus, e.g., DRAM, 200. The memory controller 100 may write data DQ to the DRAM 200 and may control the DRAM 200 to read the written data DQ. For write and read operations, the memory controller 100 may provide a command CMD, an address ADD, and clock signals CK and WCK to the DRAM 200. The memory controller 100 may include a command and address (referred to as CMD/ADD) generator 110, a CMD/ADD transmitter 120, a clock signal generator 130, clock signal transmitters 140 and 150, and a data transceiver 160.

Referring to FIG. 3, the clock signal generator 130 may include an oscillator 131 and a phase-locked loop (PLL) or delay-locked loop (DLL) circuit (referred to as a PLL/DLL circuit) 132. The clock signal generator 130 may generate a main clock signal CK and a data clock signal WCK. The oscillator 131 may output an oscillation signal having a predetermined frequency. The PLL/DLL circuit 132 may generate the main clock signal CK having a predetermined frequency and the data clock signal WCK having a different frequency, e.g., two times higher frequency, than the main clock signal CK using the oscillation signal. The PLL/DLL circuit 132 may adjust a phase of the data clock signal WCK based on a phase detection signal PDS fed back from the DRAM 200.

The main clock transmitter 140 and the data clock transmitter 150 may respectively transmit the main clock signal CK and the data clock signal WCK from the clock signal generator 130 to the DRAM 200. The CMD/ADD transmitter 120 may transmit a command CMD and an address ADD to the DRAM 200 in response to the main clock signal CK. The data transceiver 160 may transmit and receive the data DQ in response to the data clock signal WCK.

The DRAM 200 may include a CMD/ADD receiver 210, a core 220, a main clock receiver 230, a data clock receiver 240, a phase tuner 250, a data transceiver 260, and a mode register set/extended mode register set (MRS/EMRS referred to as MRS) circuit 270. The main clock receiver 230 and the data clock receiver 240 may respectively receive the main clock signal CK and the data clock signal WCK from the memory controller 100. The CMD/ADD receiver 210 may receive the command CMD and the address ADD from the memory controller 100 in response to the main clock signal CK.

While the block diagrams of exemplary embodiments of the memory controller 100 and the DRAM 200 are illustrated in FIG. 2, it should be understood that embodiments are not limited thereto. For example, the memory controller 100 and/or the DRAM 200 may include additional elements than those illustrated in FIG. 2.

Referring to FIG. 4, the CMD/ADD receiver 210 may include a flip-flop that may latch and output the CMD/ADD transmitted from the memory controller 100 in response to the main clock signal CK. Like the CMD/ADD receiver 210, the CMD/ADD transmitter 120 of the memory controller 100 may also include a flip-flop that latches and outputs the CMD/ADD to the DRAM 200 in response to the main clock signal CK.

Referring to FIG. 2, the MRS circuit 270 may set an internal mode register according to an MRS command and an address ADD received from the CMD/ADD receiver 210. A phase shift control signal TS, which will be described later, may be an MRS value set by the MRS circuit 270.

Referring to FIG. 5, the phase tuner 250 may divide the data clock signal WCK by a predetermined division ratio, e.g., 2, to generate a frequency-divided clock signal WCK/2 that has a same frequency as the main clock signal CK. The phase tuner 250 may also generate multiphase frequency-divided clock signals, e.g., 0-, 90-, 180-, and 270-degree frequency-divided clock signals WCK/2_0, WCK/2_90, WCK/2_180, and WCK/2_270, at phase intervals of 90 degrees from the frequency-divided clock signal WCK/2. Also, the phase tuner 250 may compare a phase of the main clock signal CK with a phase of one, e.g., WCK/2_0, of the multiphase frequency-divided clock signals WCK/2_0, WCK/2_90, WCK/2_180, and WCK/2_270 and may feed back a comparison result, i.e., a phase detection signal PDS to the memory controller 100. For such operations, the phase tuner 250 may include a divider 251, a multiphase signal generator 252 and 253, and a phase detector 254. More particularly, the multiphase signal generator may include a multiphase generator 252 and a selector 253.

The divider 251 may divide the data clock signal WCK by 2 so as to generate the frequency-divided clock signal WCK/2. The multiphase generator 252 may shift the frequency-divided clock signal WCK/2 by 90, 180 and 270 degrees so as to generate the multiphase frequency-divided clock signals WCK/2_0, WCK/2_90, WCK/2_180 and WCK/2_270. Alternatively, e.g., the multiphase generator 252 may invert the frequency-divided clock signal WCK/2 so as to generate an inverted frequency-divided clock signal having a 180 degree phase difference from the frequency-divided clock signal WCK/2 and may generate the multiphase frequency-divided clock signals, e.g., 0, 90, 180 and 270 degree frequency-divided clock signals WCK/2_0, WCK/2_90, WCK/2_180 and WCK/2_270, at phase intervals of 90 degrees using the two clock signals, i.e., the frequency-divided clock signal WCK/2 and the inverted frequency-divided clock signal.

The selector 253 may arrange the multiphase frequency-divided clock signals, e.g., 0, 90, 180, and 270 degree frequency-divided clock signals WCK/2_0, WCK/2_90, WCK/2_180 and WCK/2_270, in response to a phase shift control signal TS and may output first, second, third and fourth phase frequency-divided clock signals WCK/2_i (where i=1, 2, 3, 4). In detail, the selector 253 may shift the multiphase frequency-divided clock signals WCK/2_0, WCK/2_90, WCK/2_180 and WCK/2_270 by a phase corresponding to the phase shift control signal TS and may output shifted signals as the first, second, third and fourth phase frequency-divided clock signals WCK/2_i, respectively.

The phase shift control signal TS may be a 2-bit signal. When the phase shift control signal TS is "00", the multiphase signal generator 252 and 253 may shift a signal by 0 degrees, i.e., does not shift the multiphase frequency-divided clock signals, e.g., 0, 90, 180 and 270 degree frequency-divided clock signals WCK/2_0, WCK/2_90, WCK/2_180 and WCK/2_270, and may output the first, second, third and fourth phase frequency-divided clock signals WCK/2_i. In this case, the first, second, third and fourth phase frequency-divided clock signals WCK/2_i may be the 0, 90, 180 and 270 degree frequency-divided clock signals WCK/2_0, WCK/2_90, WCK/2_180 and WCK/2_270, respectively.

When the phase shift control signal TS is "01", the multiphase signal generator 252 and 253 may shift by 90 degrees the multiphase frequency-divided clock signals, e.g., 0, 90, 180 and 270 degree frequency-divided clock signals WCK/2_0, WCK/2_90, WCK/2_180 and WCK/2_270, and may output shifted results as the first, second, third and fourth phase frequency-divided clock signals WCK/2_i. In this case, the first, second, third and fourth phase frequency-divided clock signals WCK/2_i may be the 90, 180, 270 and 0 degree frequency-divided clock signals WCK/2_90, WCK/2_180, WCK/2_270 and WCK/2_0, respectively.

When the phase shift control signal TS is "10", the multiphase signal generator (252 and 253) may shift by 180 degrees the multiphase frequency-divided clock signals, e.g., 0, 90, 180 and 270 degree frequency-divided clock signals WCK/2_0, WCK/2_90, WCK/2_180 and WCK/2_270, and may output shifted results as the first, second, third and fourth phase frequency-divided clock signals WCK/2_i. In this case, the first, second, third and fourth phase frequency-divided clock signals WCK/2_i may be the 180, 270, 0 and 90 degree frequency-divided clock signals WCK/2_180, WCK/2_270, WCK/2_0 and WCK/2_90, respectively.

When the phase shift control signal TS is "11", the multiphase signal generator (252 and 253) may shift by 270 degrees the multiphase frequency-divided clock signals, e.g., 0, 90, 180 and 270 degree frequency-divided clock signals WCK/2_0, WCK/2_90, WCK/2_180 and WCK/2_270, and may output shifted results as the first, second, third and fourth phase frequency-divided clock signals WCK/2_i. In this case, the first, second, third and fourth phase frequency-divided clock signals WCK/2_i may be the 270, 0, 90 and 180 degree frequency-divided clock signals WCK/2_270, WCK/2_0, WCK/2_90 and WCK/2_180, respectively.

The phase detector 254 may receive the main clock signal CK and one of the first, second, third and fourth phase frequency-divided clock signals WCK/2_i, may compare phases of the two signals with each other, and may generate the phase detection signal PDS corresponding to a comparison result. In such embodiments, the first of the first, second, third and fourth phase frequency-divided clock signals WCK/2_i may be the first phase frequency-divided clock signal WCK/2_1, but embodiments are not limited thereto.

Referring to FIG. 6, the phase detector 254 may include a flip-flop, which may latch the first phase frequency-divided clock signal WCK/2_1 in response to the main clock signal CK and output the phase detection signal PDS. The phase detection signal PDS may be a 1-bit signal indicating a phase corresponding to which one of the main clock signal CK and the first phase frequency-divided clock signal WCK/2_1 leads. For example, when the phase of the first phase frequency-divided clock signal WCK/2_1 leads the phase of the main clock signal CK, the phase detection signal PDS may be set to a high level of "1". When the phase of the first phase frequency-divided clock signal WCK/2_1 lags the phase of the main clock signal CK, the phase detection signal PDS may be set to a low level of "0".

The phase detection signal PDS may be fed back to the memory controller 100. More particularly, e.g., the phase detection signal PDS may be fed back to the memory controller 100 via an error detection code (EDC) line for transmitting an EDC signal, but embodiments are not limited thereto. The memory controller 100 may determine the phase shift control signal TS. The memory controller 100 may select an amount of phase shift for the frequency-divided clock signal WCK/2 in the DRAM 200 based on the phase detection signal PDS fed back from the DRAM 200 and may control a phase of the data clock signal WCK transmitted to the DRAM 200 from the memory controller 100.

The data transceiver 260 in the DRAM 200 may transmit and receive the data DQ in response to the first, second, third and fourth phase frequency-divided clock signals WCK/2_i. The core 220 may include a memory cell array for storing the data DQ.

Figure 7:
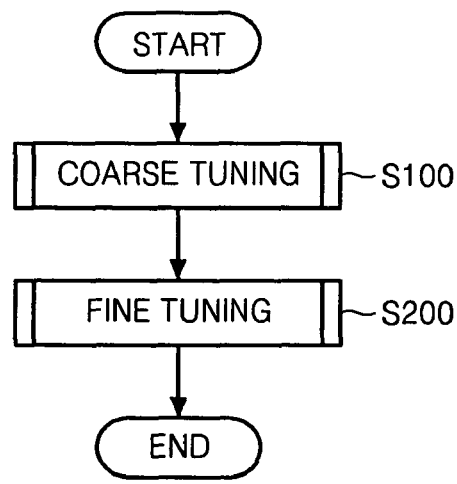
FIG. 7 illustrates a flowchart of an exemplary embodiment of a phase tuning method.

FIG. 7 illustrates a flowchart of an exemplary embodiment of a phase tuning method. The exemplary phase tuning method may be performed by the exemplary memory system 10 illustrated in FIG. 2. Referring to FIG. 7, in general, the phase tuning method may include a coarse tuning operation S100 and a fine tuning operation S200.

In the coarse tuning operation S100, the memory controller 100 may sequentially change the phase shift control signal TS in the DRAM 200, receive the phase detection signal PDS with respect to each phase shift control signal TS from the DRAM 200, determine the phase shift control signal TS based on the phase detection signal PDS fed back with respect to each phase shift control signal TS, and set the determined phase shift control signal TS in the DRAM 200.

Figure 8:
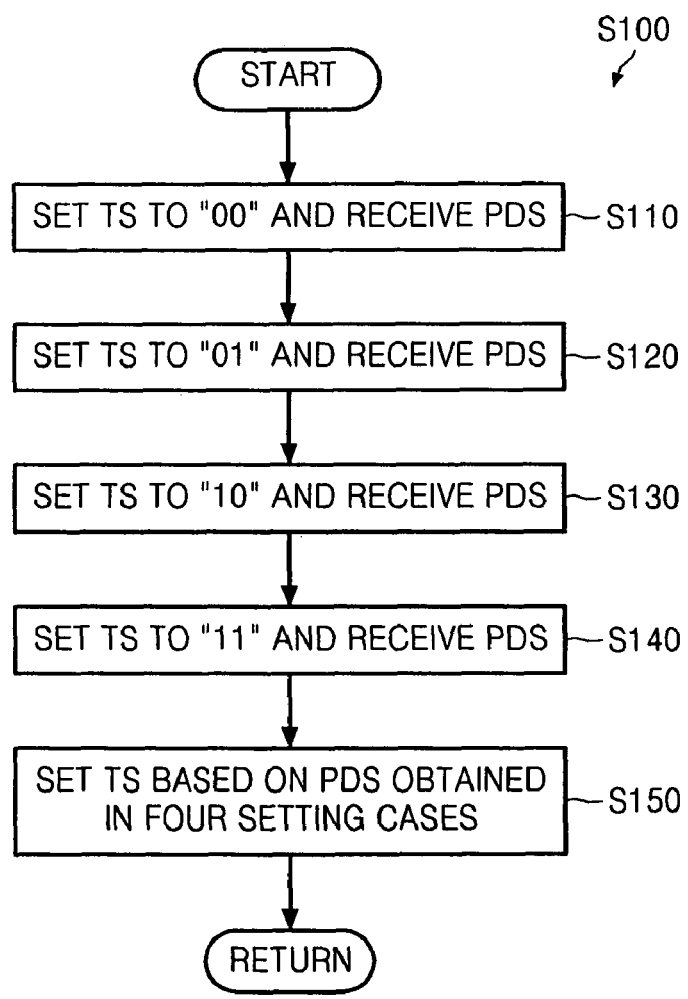
FIG. 8 illustrates a flowchart of an exemplary embodiment of a coarse tuning operation of the exemplary method illustrated in FIG. 7.
Figure 9:
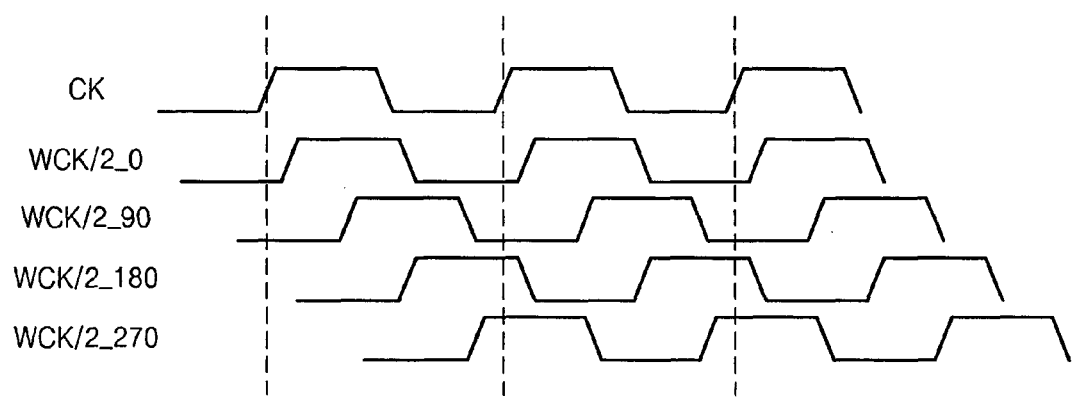
FIG. 9 illustrates an exemplary waveform diagram of a main clock signal and multiphase frequency-divided clock signals employable during the coarse tuning operation of FIG. 8.

FIG. 8 illustrates a flowchart of an exemplary embodiment of a coarse tuning operation of the exemplary method illustrated in FIG. 7. FIG. 9 illustrates an exemplary waveform diagram of a main clock signal and multiphase frequency-divided clock signals employable during the coarse tuning operation of FIG. 8. More particularly, FIG. 9 illustrates exemplary waveforms of the main clock signal CK and the multiphase frequency-divided clock signals WCK/2_0, WCK/2_90, WCK/2_180, and WCK/2_270 employable during the exemplary coarse tuning operation.

Referring to FIGS. 8 and 9, during operation S110, the memory controller 100 may control the DRAM 200 to set the phase shift control signal TS to "00" and receive the phase detection signal PDS corresponding to the phase shift control signal TS of "00" from the DRAM 200. When the phase shift control signal TS is set to "00", the DRAM 200 may generate the multiphase frequency-divided clock signals, e.g., 0, 90, 180 and 270 degree frequency-divided clock signals WCK/2_0, WCK/2_90, WCK/2_180 and WCK/2_270, shift the multiphase frequency-divided clock signals by a phase shift amount, e.g., 0 degrees, corresponding to the phase shift control signal TS, and output the first, second, third and fourth phase frequency-divided clock signals WCK/2_i (i=1, 2, 3, 4). In such embodiments, the first, second, third and fourth phase frequency-divided clock signals WCK/2_i may be 0, 90, 180 and 270 degree frequency-divided clock signals WCK/2_0, WCK/2_90, WCK/2_180 and WCK/2_270, respectively.

The phase detector 254 may compare the phase of the main clock signal CK with that of the first phase frequency-divided clock signal WCK/2_1, i.e., the 0-degree frequency-divided clock signal WCK/2_0 and feed back the phase detection signal PDS corresponding to a comparison result to the memory controller 100. In the exemplary embodiment, e.g., when the phase shift control signal TS is "00", the phase detection signal PDS may be "0."

Referring to FIG. 8, during operation S120, the memory controller 100 may control the DRAM 200 to set the phase shift control signal TS to "01" and receive the phase detection signal PDS corresponding to the phase shift control signal TS of "01" from the DRAM 200. When the phase shift control signal TS is set to "01", the DRAM 200 may generate the multiphase frequency-divided clock signals, e.g., 0, 90, 180, and 270 degree frequency-divided clock signals WCK/2_0, WCK/2_90, WCK/2_180 and WCK/2_270, shifts the multiphase frequency-divided clock signals by a phase shift amount, e.g., 90 degrees, corresponding to the phase shift control signal TS (=01), and output the first, second, third and fourth phase frequency-divided clock signals WCK/2_i (i=1, 2, 3, 4). The phase detector 254 may compare the phase of the main clock signal CK with that of the first phase frequency-divided clock signal WCK/2_1, i.e., the 90-degree frequency-divided clock signal WCK/2_90 and feed back the phase detection signal PDS corresponding to a comparison result to the memory controller 100. In the exemplary embodiment, e.g., when the phase shift control signal TS is "01", the phase detection signal PDS may be "0."

In the same manner, during operation S130, the memory controller 100 may set the phase shift control signal TS to "10" and receive the phase detection signal PDS corresponding to the phase shift control signal TS of "10" from the DRAM 200. During operation S140, the memory controller 100 may set the phase shift control signal TS to "11" and receive the phase detection signal PDS corresponding to the phase shift control signal TS of "11" from the DRAM 200. In the exemplary embodiment, e.g., when the phase shift control signal TS is "10", the phase detection signal PDS may be "1."

In the exemplary embodiment, e.g., when the phase shift control signal TS is "11", the phase detection signal PDS may be "1."

During operation S150, the memory controller 100 may determine the phase shift control signal TS for selecting the phase shift amount, by which the frequency-divided clock signal WCK/2 may be shifted, based on the phase detection signal PDS corresponding to the above-described four setting cases and may set the determined phase shift control signal TS in the MRS circuit 270 of the DRAM 200 using the command/address CMD/ADD.

Referring to FIG. 9, a first edge (e.g., a rising edge) of the main clock signal CK may exist between first edges (e.g., rising edges) of neighboring multiphase frequency-divided clock signals corresponding to the phase detection signal PDS making a transition from "1" to "0". Since the phase detection signal PDS is "1" when the phase shift control signal TS is "11 and is "0" when the phase shift control signal TS is "00", the rising edge of the main clock signal CK may exist between a rising edge of the first phase frequency-divided clock signal WCK/2_1, i.e., the 270-degree frequency-divided clock signal WCK/2_270, which may be obtained when the phase shift control signal TS is "11" and an adjacent rising edge of the first phase frequency-divided clock signal WCK/2_1, i.e., the 0-degree frequency-divided clock signal WCK/2_0, which may be obtained when the phase shift control signal TS is "00".

In this case, the memory controller 100 may set the phase shift control signal TS to "00" or "11" based on the phase detection signal PDS obtained in the four setting cases. At this time, the rising edge of the main clock signal CK and the rising edge of the 0-degree frequency-divided clock signal WCK/2_0 or the 270-degree frequency-divided clock signal WCK/2_270 may have a phase difference of less than ±45 degrees, i.e., ±⅛ tCK, where tCK is a single period of the main clock signal CK.

In other words, after the exemplary coarse tuning operation S100, the phase difference between the main clock signal CK and a selected phase frequency-divided clock signal may be less than ±45 degrees. The selected phase frequency-divided clock signal may be a frequency-divided clock signal having a phase corresponding to the phase shift control signal TS set by the memory controller 100 among the multiphase frequency-divided clock signals, e.g., 0, 90, 180 and 270 degree frequency-divided clock signals WCK/2_0, WCK/2_90, WCK/2_180, and WCK/2_270. When the phase difference between the main clock signal CK and the selected phase frequency-divided clock signal is less than ±45 degrees through the coarse tuning operation, a time for the fine tuning may be reduced.

Figure 10:
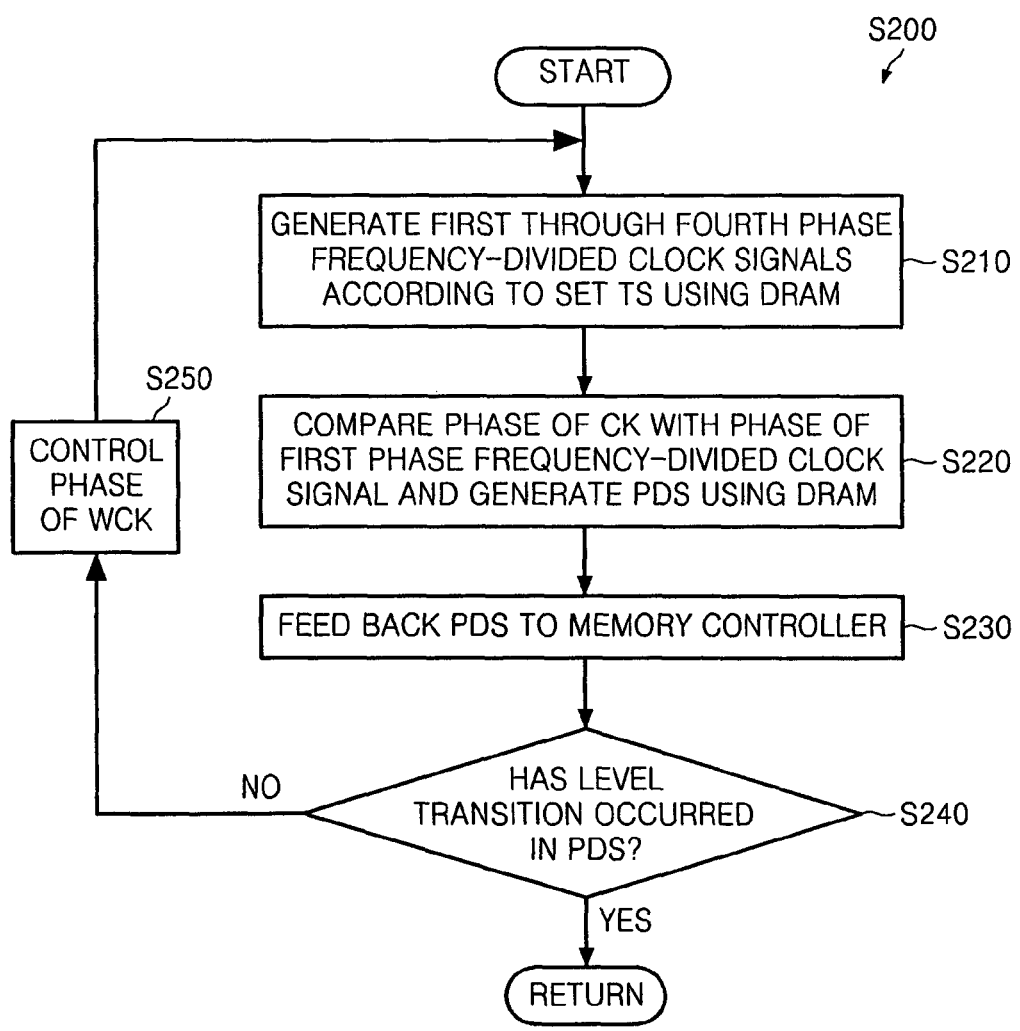
FIG. 10 illustrates a flowchart of an exemplary embodiment of a fine tuning operation of the exemplary method illustrated in FIG. 7.
Figure 11:
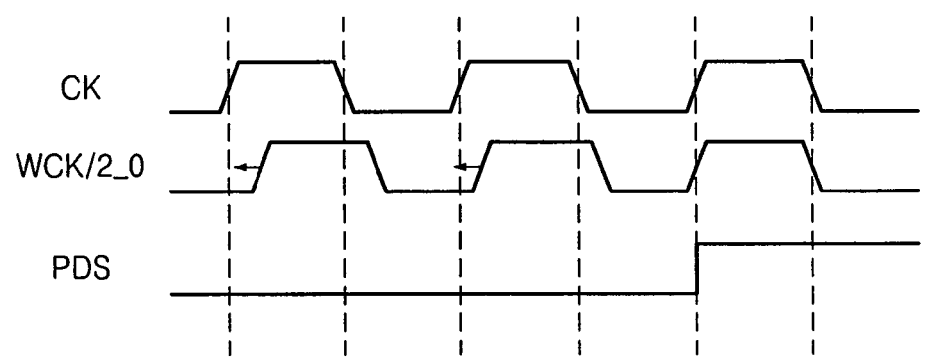
FIG. 11 illustrates an exemplary waveform diagram of a main clock signal and a selected phase frequency-divided clock signal employable during the fine tuning operation of FIG. 9.

FIG. 10 illustrates a flowchart of an exemplary embodiment of the fine tuning operation S200 of the exemplary method illustrated in FIG. 7. FIG. 11 illustrates an exemplary waveform diagram of the main clock signal CK and a selected phase frequency-divided clock signal employable during the fine tuning operation S200 of FIG. 10.

It is assumed that the phase shift control signal TS is set to "00" after the coarse tuning and the selected phase frequency-divided clock signal, i.e., the first phase frequency-divided clock signal WCK/2_1 is the 0-degree frequency-divided clock signal WCK/2_0. In other words, it is assumed, e.g., that the memory controller 100 has set the phase shift control signal TS to "00" in the DRAM 200.

During operation S210, the DRAM 200 may generate the first, second, third and fourth phase frequency-divided clock signals WCK/2_i (i=1, 2, 3, 4) according to the phase shift control signal TS of "00". During operation S220, the DRAM

200 may compare the phase of the first phase frequency-divided clock signal WCK/2_1 with the phase of the main clock signal CK so as to generate the phase detection signal PDS. During operation S230, the phase detection signal PDS may be fed back to the memory controller 100. At this time, because the phase of the first phase frequency-divided clock signal WCK/2_1, i.e., the 0-degree frequency-divided clock signal WCK/2_0 lags the phase of the main clock signal CK, the phase detection signal PDS may be "0".

During operation 240, the memory controller 100 may determine whether a level transition has occurred in the phase detection signal PDS. For instance, when the phase detection signal PDS is still "0", the memory controller 100 controls, e.g., pulls, the phase of the data clock signal WCK by a predetermined phase step before transmitting the data clock signal WCK so that the phase of the first phase frequency-divided clock signal WCK/2_1 may be pulled, as illustrated in FIG. 11. During operation S250, the memory controller 100 may control the phase of the data clock signal WCK in one direction (e.g. a pulling direction) by the predetermined phase step until the phase detection signal PDS fed back to the memory controller 100 transitions to "1". When the phase detection signal PDS is "1", the fine tuning ends.

In some embodiments, during the coarse tuning operation S100, a phase of the frequency-divided clock signal WCK/2 may be repeatedly shifted by 90 degrees to generate, e.g., four multiphase frequency-divided clock signals and one of the frequency-divided clock signals having a phase difference of less than ±45 degrees, i.e., a difference of ±⅛ tCK, from the main clock signal CK among the four multiphase frequency-divided clock signals so as to determine the phase shift amount. In embodiments, when the phase of the frequency-divided clock signal WCK/2 is repeatedly shifted by 90 degrees to sweep 360 degrees by changing the phase shift control signal TS and a result of comparing the shifted phases with the phase of the main clock signal CK is detected, a relationship between the frequency-divided clock signal WCK/2 in the DRAM 200 and the main clock signal CK may be detected before the fine tuning operation S100.

As a result, in embodiments, a phase shift amount by which the phase of the frequency-divided clock signal WCK/2 is shifted may be determined such that the frequency-divided clock signal WCK/2 and the main clock signal CK have a minimum phase skew or a phase skew of less than ±45 degrees, i.e., ±⅛ tCK from each other. For instance, the phase shift amount may be determined such that one of two multiphase frequency-divided clock signals having adjacent rising edges between which a rising edge of the main clock signal CK exists is selected from among at least four multiphase frequency-divided clock signals. Thereafter, the memory controller 100 may set the phase shift control signal TS for generating the determined phase shift amount in the DRAM 200 before the fine tuning operation S200 may be performed.

By performing a course tuning operation S100 such that a phase difference between the main clock signal CK and the selected phase frequency-divided clock signal is equal to or less than ±45 degrees, a time employed for fine tuning may be reduced.

Take, e.g., a comparative case of a phase tuning method in which a DRAM compares a phase of a main clock signal with a phase of a frequency-divided clock signal obtained by dividing a data clock signal by 2 and feeds back a comparison result to a controller that controls a phase of the data clock signal to align the phase of the main clock signal and the phase of the frequency-divided clock signal, the main clock signal and the frequency-divided clock signal have a maximum phase difference of ±½ tCK, i.e., ±180 degrees therebetween. Thus, in the comparative case, a phase tuning range is ±½ tCK, i.e., a phase tuning time for aligning the phase of the main clock signal and the phase of the frequency-divided clock signal includes time for the controller to shift the phase of the data clock signal by ½ tCK while shifting the phase of the data clock signal by a predetermined phase step at a time.

Accordingly, in comparison to the comparative case, e.g., embodiments may be advantageous by at least reducing a phase tuning time, e.g., a fine turning time, to a range of about ±½ tCK or less. More particularly, e.g., such a reduction in phase tuning time that may be achieved by embodiments may be particularly advantageous when, e.g., a data clock signal is disabled, e.g., in a case where the power of the DRAM is down or the DRAM has undertaken a self-refresh mode, repetitive phase tuning may be required to align a phase of a main clock signal and a phase of a data clock signal or a ½ frequency-divided clock signal.

Further, embodiments may enable high speed operation to be performed effectively and/or may reduce system power consumption by reducing a phase tuning time.

In some embodiments, a phase tuning method employing an inversion scheme for inverting the data clock signal WCK may be used to reduce the phase tuning time. When an inversion scheme is used, the main clock signal CK and the frequency-divided clock signal WCK/2 may have a maximum phase difference of ±¼ tCK, i.e., ±90 degrees. As a result, in embodiments, e.g., a phase tuning time may be reduced from ±½ tCK to ±¼ tCK.

As described above, in some embodiments, as a result of a course timing operation S100 according to embodiments, a range of a fine tuning operation S200 may be equal to or less than ±45 degrees, i.e., ⅛ tCK. In other words, in some embodiments, the main clock signal CK and the selected phase frequency-divided clock signal WCK/2_i (i=1, 2, 3, or 4) may have a maximum phase difference of ±⅛ tCK, i.e., ±45 degrees. As a result, the phase tuning range may be reduced from ±¼ tCK to ±⅛ tCK. Accordingly, fine tuning time is reduced, and therefore, time for phase synchronization (or phase tuning) is also reduced. By reducing a phase tuning time, embodiments may enable an increase in an operating speed of a memory apparatus and/or a decrease in power consumption.

Figure 12A:
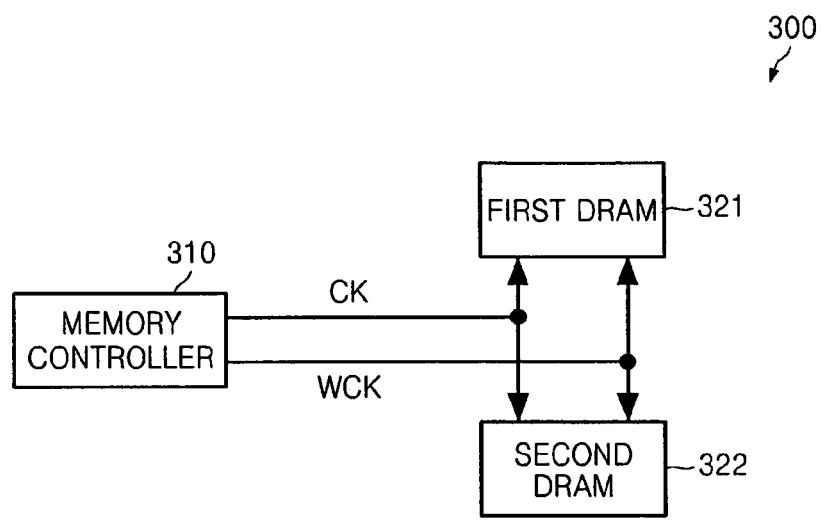
FIG. 12A illustrates a block diagram of a second exemplary embodiment of a memory system.
Figure 12B:
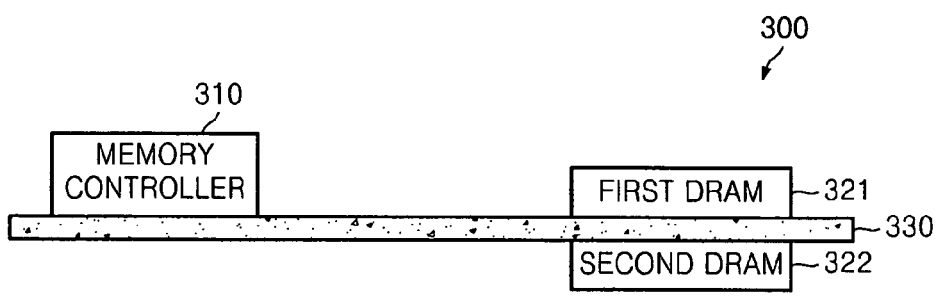
FIG. 12B illustrates a schematic diagram of a second exemplary embodiment of the memory system of FIG. 12A.

FIG. 12A illustrates a block diagram of a second exemplary embodiment of a memory system 300. FIG. 12B illustrates a schematic diagram of a second exemplary embodiment of the memory system of FIG. 12A.

Referring to FIGS. 12A and 12B, the memory system 300 may include a memory controller 310, at least two DRAMs 321 and 322 (referred to as a first DRAM 321 and a second DRAM 322), and a board 330 on which the memory controller 310 and the at least two DRAMs 321 and 322 may be mounted. While two DRAMs 321, 322 are illustrated in the exemplary embodiment of FIGS. 12A and 12B, embodiments are not limited thereto. For example, in some embodiments a memory system may include 3 or more DRAMs.

Referring to FIG. 12B, the first DRAM 321 and the second DRAM 322 may be mounted on opposite sides, respectively, of the board 330. In this structure, the first DRAM 321 and the second DRAM 322 may share an address ADD, a command CMD, and clock signals CK and WCK. In other words, the first DRAM 321 and the second DRAM 322 may be connected with the memory controller 310 via a common address line, a common command line, and common clock signal lines. Accordingly, the main clock signal CK and the data clock signal WCK may be transmitted from the memory controller 310 via the common clock signal lines, respectively, and then distributed to the first DRAM 321 and the second DRAM 322. The structure and the operations of the memory controller 310 and the first and second DRAMs 321 and 322 may be the same as those of the memory controller 100 and the DRAM 200 illustrated in FIG. 2. Thus, descriptions thereof will be omitted.

Figure 13A:
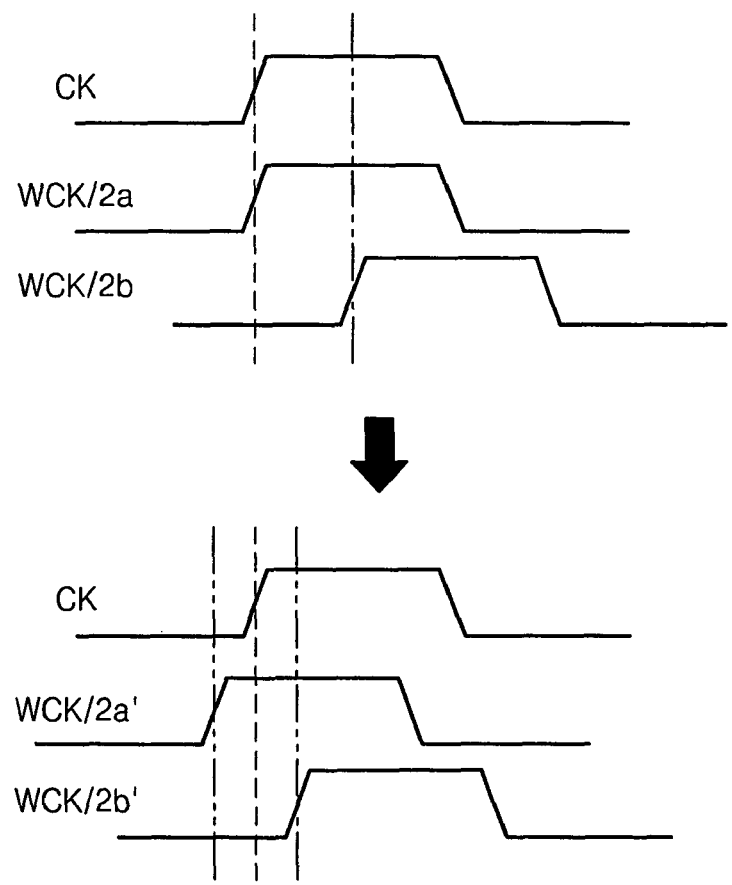
FIGS. 13A and 13B illustrate waveform diagrams for explaining differences between a phase tuning method and an exemplary embodiment of a phase tuning method that may be employed with the memory system illustrated in FIGS. 12A and 12B.
Figure 13B:
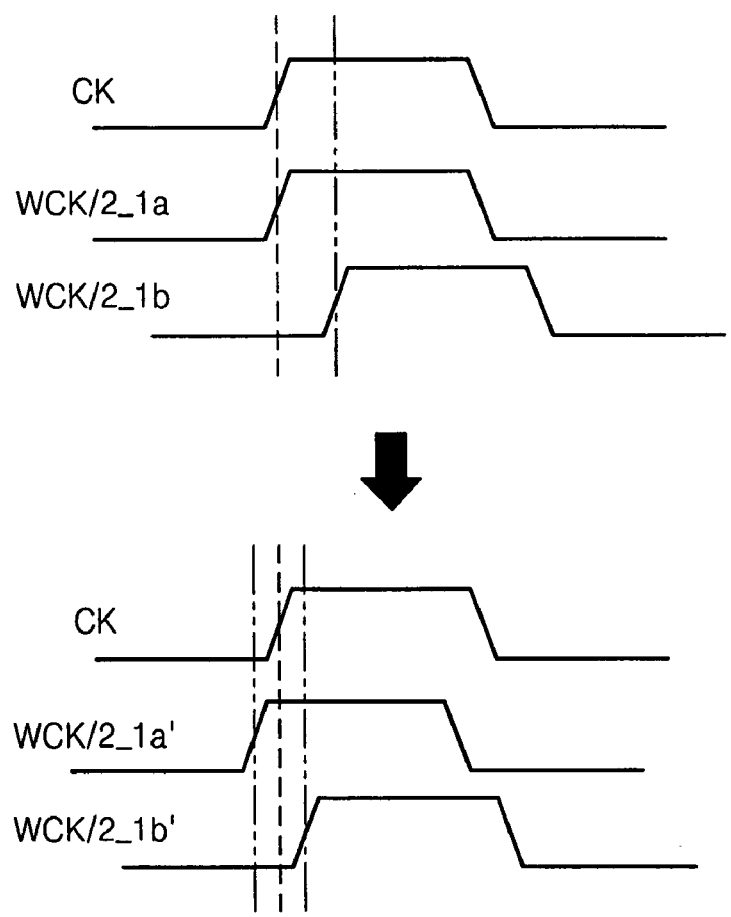

FIGS. 13A and 13B illustrate waveform diagrams for explaining differences between other phase tuning methods and an exemplary embodiment of a phase tuning method that may be employed with the memory system 300 illustrated in FIGS. 12A and 12B.

To perform phase tuning using the memory system 300 illustrated in FIGS. 12A and 12B, phase tuning between the main clock signal CK and the data clock signal WCK may be first performed with respect to the first DRAM 321 and then performed with respect to the second DRAM 322. The exemplary phase tuning operations described above with regard to FIGS. 7, 8 and 9 may be employed to perform phase tuning for each of the DRAMs 321 and 322. Thus, descriptions thereof will be omitted.

In embodiments, when the phase tuning is performed with respect to the first DRAM 321, a first phase shift control signal may be set in an MRS circuit of the first DRAM 321 and a first phase value for synchronizing the phase of the main clock signal CK with the phase of the data clock signal WCK in the first DRAM 321 may be stored in the memory controller 310. When the phase tuning is performed with respect to the second DRAM 322, a second phase shift control signal may be set in an MRS circuit of the second DRAM 322 and a second phase value for synchronizing the phase of the main clock signal CK with the phase of the data clock signal WCK in the second DRAM 322 may be stored in the memory controller 310.

In embodiments, the memory controller 310 may calculate an average of the first and second phase values and control the phase of the data clock signal WCK to correspond to the average of the first and second phase values. In other words, the memory controller 310 may adjust the phase of the data clock signal WCK to an average phase of the data clock signal WCK subjected to fine tuning for the first DRAM 321 and the data clock signal WCK subjected to fine tuning for the second DRAM 322 and then transmit the data clock signal WCK having the adjusted phase to the first DRAM 321 and the second DRAM 322.

Referring to FIG. 13B, in embodiments, if the data clock signal WCK whose phase is set to that of the data clock signal WCK subjected to the fine tuning for one of the DRAMs 321 and 322 is transmitted to both of the DRAMs 321 and 322, the phase of a tuned phase frequency-divided clock signal WCK/2_1a may be synchronized with the phase of the main clock signal CK in the first DRAM 321, but the phase of a tuned phase frequency-divided clock signal WCK/2_1b may have a maximum difference of ±45 degrees, i.e., ±⅛ tCK from the phase of the main clock signal CK in the second DRAM 322.

Referring to FIG. 13B, in embodiments, when the memory controller 310 adjusts the phase of the data clock signal WCK to the average phase of the data clock signal WCK/2_1a subjected to the fine tuning for the first DRAM 321 and the data clock signal WCK/2_1b subjected to the fine tuning for the second DRAM 322 and transmitting the data clock signal WCK having the average phase to the first and second DRAMs 321 and 322, a maximum skew between the main clock signal CK and the data clock signal WCK/2_1a' in the first DRAM 321 and the data clock signal WCK/2_1b' in the second DRAM 322 may be reduced to ±1/16 tCK or less, as illustrated in FIG. 13B.

Referring to FIG. 13A, when, e.g., the comparative phase tuning method described above, is used in the memory system 300 illustrated in FIGS. 12A and 12B, the phase of the data clock signal WCK transmitted from the memory controller 310 to the first and second DRAMs 321 and 322 may be adjusted to an average phase of the data clock signal WCK/2a subjected to tuning for the first DRAM 321 and the data clock signal WCK/2b subjected to tuning for the second DRAM 322. As illustrated in FIG. 13A, a maximum skew between the main clock signal CK and the data clock signal WCK/2a', WCK/2b' may be reduced to ±⅛ tCK or less in the first and second DRAMs 321 and 322.

Accordingly, it can be appreciated that embodiments may enable a phase skew between a main clock signal and a data signal of a memory system, e.g., a memory system in which at least two memory devices share clock signals, to be further reduced.

One or more aspects described herein may be embodied as computer readable codes on a computer readable recording medium. A computer readable recording medium is any data storage device that can store data that can be thereafter read by a computer system. Examples of computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that computer readable code is stored and executed in a distributed fashion. Also, functional programs, codes, and code segments for accomplishing one or more aspects of the embodiments described herein may be easily construed by programmers skilled in the art to which embodiments pertain.

As described above, in embodiments, a phase of a main clock signal and a phase of a data clock signal having a different frequency than the main clock signal or a phase of a frequency-divided signal of the data clock signal may be more quickly synchronized with each other in a semiconductor memory apparatus.

Embodiments may enable an operating speed of the memory apparatus to be increased and/or power consumption to be decreased.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory apparatus configured to employ a data clock signal that has a different frequency than a main clock signal, the semiconductor memory apparatus comprising:
a clock signal receiver configured to receive the main clock signal and the data clock signal from a memory controller; and
a phase tuner configured to:
during coarse tuning, generate a frequency-divided clock signal having a same frequency as the main clock signal by dividing a frequency of the data clock signal,
during the coarse tuning, generate from the frequency-divided clock signal at least four multiphase frequency-divided clock signals having the same frequency as the frequency-divided clock signal and different phases from one another, during the coarse tuning, compare each phase of the at least four multiphase frequency-divided clock signals with a phase of the main clock signal, during the coarse tuning, feed back each comparison result to the memory controller, and during fine tuning, compare a phase of a signal selected from the at least four multiphase frequency-divided clock signals with the phase of the main clock signal and feed back a comparison result to the memory controller.

2. The semiconductor memory apparatus as claimed in claim 1, wherein the phase tuner comprises:

a divider configured to divide a frequency of the data clock signal to generate the frequency-divided clock signal;

a multiphase signal generator configured to repeatedly shift the frequency-divided clock signal to generate the at least four multiphase frequency-divided clock signals at a predetermined phase interval and arrange and output the at least four multiphase frequency-divided clock signals in response to a phase shift control signal set by the memory controller; and a phase detector configured to compare a phase of one of the at least four arranged multiphase frequency-divided clock signals with the phase of the main clock signal and generate a phase detection signal, wherein the at least four arranged multiphase frequency-divided clock signals are used to transmit and receive data.

3. The semiconductor memory apparatus as claimed in claim 2, wherein the predetermined phase interval is 90 degrees and the at least four multiphase frequency-divided clock signals are signals obtained by shifting the frequency-divided clock signal by 0, 90, 180 and 270 degrees, respectively.

4. The semiconductor memory apparatus as claimed in claim 3, wherein the phase shift control signal is set by the memory controller in a mode register set circuit included in the semiconductor memory apparatus.

5. The semiconductor memory apparatus as claimed in claim 1, wherein the phase tuner comprises:

a divider configured to divide a frequency of the data clock signal so as to generate the frequency-divided clock signal;

a multiphase signal generator configured to shift the frequency-divided clock signal by a phase shift amount corresponding to a phase shift control signal set by the memory controller to generate a phase-shifted frequency-divided clock signal; and a phase detector configured to compare a phase of the phase-shifted frequency-divided clock signal with the phase of the main clock signal and feed back a comparison result.

6. The semiconductor memory apparatus as claimed in claim 5, wherein the phase shift amount is 90 degrees, and wherein the multiphase signal generator comprises:

a multiphase generator configured to repeatedly shift the frequency-divided clock signal by 90 degrees to generate 0, 90, 180 and 270 degree frequency-divided clock signals; and a selector configured to arrange the 0, 90, 180 and 270 degree frequency-divided clock signals and output them in arranged order as first, second, third and fourth frequency-divided clock signals in response to the phase shift control signal.

7. The semiconductor memory apparatus as claimed in claim 6, wherein the phase shift control signal is set by the memory controller in a mode register set circuit included in the semiconductor memory apparatus.

8. The semiconductor memory apparatus as claimed in claim 1, wherein the frequency of the main clock signal is ½ of the frequency of the data clock signal and the phase tuner includes a divider configured to divide a frequency of the data clock signal by 2 to generate the frequency-divided clock signal.

9. The semiconductor memory apparatus as claimed in claim 1, wherein the comparison result is fed back to memory controller via a line used to transmit an error detection code to the memory controller.

10. The semiconductor memory apparatus as claimed in claim 1, wherein the signal selected from the at least four multiphase frequency-divided clock signals is one of two signals having their first edges closest to a first edge of the main clock signal among the at least four multiphase frequency-divided clock signals.

11. A memory system using a data clock signal that has a different frequency than a main clock signal, the memory system comprising:

a first memory apparatus configured to:

receive the data clock signal, divide a frequency of the data clock signal to generate a first frequency-divided clock signal having the same frequency as the main clock signal, repeatedly shift the first frequency-divided clock signal to generate at least four multiphase frequency-divided clock signals at a predetermined phase interval, which have a same frequency as and different phases than the first frequency-divided clock signal, and compare a phase of each of the at least four multiphase frequency-divided clock signals with a phase of the main clock signal, and output a comparison result; and a memory controller configured to transmit the main clock signal and the data clock signal to the first memory apparatus, receive the comparison result from the first memory apparatus, and select one signal from the at least four multiphase frequency-divided clock signals based on the comparison result, wherein the first memory apparatus compares a phase of the selected multiphase frequency-divided clock signal with the phase of the main clock signal and feeds back a comparison result to the memory controller, and wherein the memory controller adjusts a phase of the data clock signal by a predetermined phase step based on the comparison result fed back from the first memory apparatus and transmits a phase-adjusted data clock signal to the first memory apparatus.

12. The memory system as claimed in claim 11, wherein the memory controller sequentially changes a first phase shift control signal to sequentially shift the first frequency-divided clock signal by 0, 90, 180, and 270 degrees, wherein the first memory apparatus generates a frequency-divided clock signal by shifting the first frequency-divided clock signal by a phase shift amount corresponding to the first phase shift control signal when the first phase shift control signal changes, compares a phase of the generated frequency-divided clock signal with the phase of the main clock signal, and feeds back a phase detection signal corresponding to the comparison result to the memory controller, and wherein the memory controller determines the first phase shift control signal for selecting a phase shift amount, by which the first frequency-divided clock signal is shifted, based on phase detection signals respectively generated with respect to the 0, 90, 180, and 270 degree shifts.

13. The memory system as claimed in claim 12, wherein the memory controller determines the first phase shift control signal for selecting a signal having a phase difference of ±45 degrees or less from the phase of the main clock signal from among frequency-divided clock signals generated by shifting the first frequency-divided clock signal by 0, 90, 180, and 270 degrees.

14. The memory system as claimed in claim 12, further comprising a second memory apparatus configured to receive the data clock signal, divide a frequency of the data clock signal to generate a second frequency-divided clock signal having the same frequency as the main clock signal, repeatedly shift the second frequency-divided clock signal to generate at least four multiphase frequency-divided clock signals at a predetermined phase interval, which have a same frequency as and different phases than the second frequency-divided clock signal, compare a phase of each of the at least four multiphase frequency-divided clock signals with the phase of the main clock signal, and output a comparison result, wherein each of the main clock signal and the data clock signal is transmitted via a single common signal line and then distributed to each of the first and second memory apparatuses.

15. The memory system as claimed in claim 14, wherein the memory controller sequentially changes a second phase shift control signal to sequentially shift the second frequency-divided clock signal by 0, 90, 180, and 270 degrees,
wherein the second memory apparatus generates a frequency-divided clock signal by shifting the second frequency-divided clock signal by a phase shift amount corresponding to the second phase shift control signal when the second phase shift control signal changes, compares a phase of the generated frequency-divided clock signal with the phase of the main clock signal, and feeds back a phase detection signal corresponding to the comparison result to the memory controller,
wherein the memory controller determines the second phase shift control signal for selecting a phase shift amount, by which the second frequency-divided clock signal is shifted, based on phase detection signals respectively generated and fed back from the second memory apparatus with respect to the 0, 90, 180, and 270 degree shifts,
wherein the second memory apparatus compares a phase of a frequency-divided clock signal, generated by shifting the second frequency-divided clock signal by the selected phase shift amount, with the phase of the main clock signal and feeds back a comparison result to the memory controller, and
wherein the memory controller adjusts the phase of the data clock signal by a predetermined phase step based on the comparison result fed back from the second memory apparatus and transmits a phase-adjusted data clock signal to the second memory apparatus.

16. The memory system as claimed in claim 15, wherein the memory controller readjusts the phase of the data clock signal to an average of the phase of the data clock signal adjusted with respect to the first memory apparatus and the phase of the data clock signal adjusted with respect to the second memory apparatus and transmits a phase-readjusted data clock signal to the first memory apparatus and the second memory apparatus.

17. A method of tuning a phase of a data clock signal that has a different frequency than a main clock signal, the method comprising:
coarse tuning by receiving the data clock signal, dividing the data clock signal to generate a frequency-divided clock signal having a same frequency as the main clock signal, repeatedly shifting the frequency-divided clock signal to generate at least four multiphase frequency-divided clock signals at a predetermined phase interval, which have the same frequency as and different phases than the frequency-divided clock signal, comparing a phase of each of the at least four multiphase frequency-divided clock signals with a phase of the main clock signal, and selecting one signal from the at least four multiphase frequency-divided clock signals based on a comparison result; and
fine tuning by comparing a phase of the selected multiphase frequency-divided clock signal with the phase of the main clock signal and adjusting the phase of the data clock signal by a predetermined phase step based on the comparison result.

18. The method as claimed in claim 17, further comprising transmitting the main clock signal and the data clock signal from a memory controller to a semiconductor memory apparatus, wherein the predetermined phase interval is 90 degrees.

19. The method as claimed in claim 18, wherein during coarse tuning:
the memory controller sequentially changes a phase shift control signal to sequentially shift the frequency-divided clock signal by 0, 90, 180, and 270 degrees;
the semiconductor memory apparatus generates a signal by shifting the frequency-divided clock signal by a phase shift amount corresponding to the phase shift control signal when the phase shift control signal changes, compares a phase of the generated signal with the phase of the main clock signal, and feeds back a phase detection signal corresponding to the comparison result to the memory controller; and
the memory controller determines the phase shift control signal for selecting a phase shift amount, by which the frequency-divided clock signal is shifted, based on phase detection signals respectively generated with respect to the 0, 90, 180 and 270 degree shifts.

20. The method as claimed in claim 19, wherein during fine tuning:
the semiconductor memory apparatus generates a signal by shifting the frequency-divided clock signal by the phase shift amount corresponding to the determined phase shift control signal, compares a phase of the generated signal with the phase of the main clock signal, and feeds back a phase detection signal corresponding to a comparison result to the memory controller; and
the memory controller adjusts the phase of the data clock signal by the predetermined phase step based on the phase detection signal.

* * * * *